United States Patent
Tobe

(12) 
(10) Patent No.: US 10,651,071 B2
(45) Date of Patent: May 12, 2020

(54) SUBSTRATE PROCESSING APPARATUS AND SUBSTRATE REMOVING METHOD

(71) Applicant: Tokyo Electron Limited, Tokyo (JP)

(72) Inventor: Yasuhiro Tobe, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/959,423

(22) Filed: Apr. 23, 2018

(65) Prior Publication Data

US 2018/0308738 A1    Oct. 25, 2018

(30) Foreign Application Priority Data

Apr. 25, 2017   (JP) ................. 2017-086675

(51) Int. Cl.
| | | |
|---|---|---|
| H01L 21/683 | (2006.01) | |
| H01J 37/32 | (2006.01) | |
| H01L 21/687 | (2006.01) | |
| H01L 21/67 | (2006.01) | |

(52) U.S. Cl.
CPC .... *H01L 21/6833* (2013.01); *H01J 37/32449* (2013.01); *H01J 37/32642* (2013.01); *H01J 37/32715* (2013.01); *H01L 21/67253* (2013.01); *H01L 21/68742* (2013.01)

(58) Field of Classification Search
CPC ............ H01L 21/6831; H01L 21/6833; H01L 37/32647; H01L 21/67253; H01L 21/68742; H01L 37/32449; H01J 37/32715

See application file for complete search history.

(56) References Cited

U.S. PATENT DOCUMENTS

| | | | | |
|---|---|---|---|---|
| 5,542,559 A | * | 8/1996 | Kawakami | H01J 37/3244 118/723 E |
| 6,500,299 B1 | * | 12/2002 | Mett | C23C 16/4402 118/723 E |
| 8,520,360 B2 | * | 8/2013 | Singh | H01L 21/6831 361/234 |
| 2002/0067585 A1 | * | 6/2002 | Fujiwara | B23Q 3/154 361/234 |
| 2006/0099457 A1 | * | 5/2006 | Moriya | C23C 16/4404 428/701 |

(Continued)

FOREIGN PATENT DOCUMENTS

| | | |
|---|---|---|
| JP | H09-260475 | 10/1997 |
| JP | H11-054604 | 2/1999 |
| JP | 2003-282691 | 10/2003 |

*Primary Examiner* — Eric A. Gates
*Assistant Examiner* — Paul M Janeski
(74) *Attorney, Agent, or Firm* — IPUSA, PLLC

(57) ABSTRACT

A substrate processing apparatus is provided. The substrate processing apparatus includes: an electro-static chuck configured to retain a substrate on a platform by electrostatic attraction; an ionized gas generation unit configured to ionize a pressure-controlled gas to generate an ionized gas; a gas supplying path, which is made of insulating material or to whose inner surface insulating processing is applied, configured to allow passage of the generated ionized gas; a gas supplying tube configured to supply the ionized gas that has passed the gas supplying path to a gap between the substrate and the electro-static chuck; and a gas exhaust path, which is provided inside the platform, configured to exhaust the gas that has been supplied to the gap.

12 Claims, 5 Drawing Sheets

(56) References Cited

U.S. PATENT DOCUMENTS

| | | | |
|---|---|---|---|
| 2009/0215338 A1* | 8/2009 | Suzuki | B63H 21/213 |
| | | | 440/86 |
| 2010/0243609 A1* | 9/2010 | Yannazawa | H01J 37/32091 |
| | | | 216/71 |
| 2014/0311676 A1* | 10/2014 | Hatoh | H01L 21/68721 |
| | | | 156/345.51 |
| 2014/0346152 A1* | 11/2014 | Sasaki | H01L 21/6831 |
| | | | 219/121.58 |
| 2019/0111541 A1* | 4/2019 | Boyd, Jr. | B24B 37/14 |

* cited by examiner

○ : HOLES FOR SUPPLYING AND EXHAUSTING IONIZED GAS (ALSO SERVING AS HOLES FOR COOLING GAS)

O : HOLES FOR LIFT PINS

SUBSTRATE PROCESSING APPARATUS AND SUBSTRATE REMOVING METHOD

BACKGROUND OF THE INVENTION

1. Field of the Invention

The present invention relates to a substrate processing apparatus and a substrate removing method.

2. Description of the Related Art

Conventionally, a method of removing a substrate from an electro-static chuck is proposed. The method includes, after plasma processing, turning off a voltage that has been applied to an electrode of the electro-static chuck, applying a voltage whose electrical polarity is opposite to the voltage that has been applied to the electrode, eliminating static electricity of the residual charges of the rear surface of the substrate by the plasma discharge, and removing the substrate from the electro-static chuck.

Further, a method of removing a substrate is proposed that includes: supplying a cooling gas to a gap between the substrate and a platform on which the substrate is placed; measuring a pressure of the supplied cooling gas; detecting the amount of the cooling gas leaking from the gap; and removing the substrate by adjusting the pressure of the cooling gas according to the detected result (refer to, for example, Patent Document 1).

Further, a method of applying ultrasonic waves is proposed as a method of removing a substrate smoothly (refer to, for example, Patent Document 2). Further, a method is proposed that includes: attaching a UV ray applying unit to a side surface of a vacuum chamber; ionizing a gas that has been introduced into a chamber; and applying the ionized gas to all of the substrate and the electro-static chuck (refer to, for example, Patent Document 3).

CITATION LIST

Patent Document

[Patent Document 1] Japanese Unexamined Patent Application Publication No. 2003-282691
[Patent Document 2] Japanese Unexamined Patent Application Publication No. H11-054604
[Patent Document 3] Japanese Unexamined Patent Application Publication No. H09-260475

SUMMARY OF THE INVENTION

In the case of the electro-static chuck whose electro-static attraction force is increased according to the increased pressure of the cooling gas, residual charges may remain in the substrate, in a dielectric of a surface of the electro-static chuck, or in a deposition film, even if the residual charge elimination using application of the reverse voltage and the plasma discharge is applied, or even if the method of Patent Document 1 is applied. In this state, if the substrate is removed from the platform, then, load may be applied to the substrate, a positional shift may occur, and the substrate may be broken.

Further, with respect to the method of Patent Document 2, there is a risk that dust may be produced by the vibration of the substrate when ultrasonic waves are applied, that the dust may be accumulated on the substrate, that the accumulated dust may have an adverse effect on the substrate processing, that the dust may remain on the surface of the electro-static chuck, and that an electrostatic attraction error may occur.

Furthermore, the residual charges exist in the dielectric of the electro-static chuck and the substrate. Therefore, with respect to the method of Patent Document 3, the static electricity elimination efficiency is not good because the ionized gas is not supplied directly. As a result, there is a risk that it takes longer time for removing the substrate.

In view of the above, an object of the present invention is to remove a substrate from an electro-static chuck smoothly.

In order to solve one or more problems described above, a substrate processing apparatus is provided. The substrate processing apparatus includes: an electro-static chuck configured to retain a substrate on a platform by electrostatic attraction; an ionized gas generation unit configured to ionize a pressure-controlled gas to generate an ionized gas; a gas supplying path, which is made of insulating material or to whose inner surface the insulating processing is applied, configured to allow passage of the generated ionized gas; a gas supplying tube configured to supply the ionized gas that has passed the gas supplying path to a gap between the substrate and the electro-static chuck; and a gas exhaust path, which is provided inside the platform, configured to exhaust the gas that has been supplied to the gap.

According to an aspect of the present invention, it is possible to remove a substrate from the electro-static chuck smoothly.

DETAILED DESCRIPTION OF THE PREFERRED EMBODIMENTS

Figure 1:
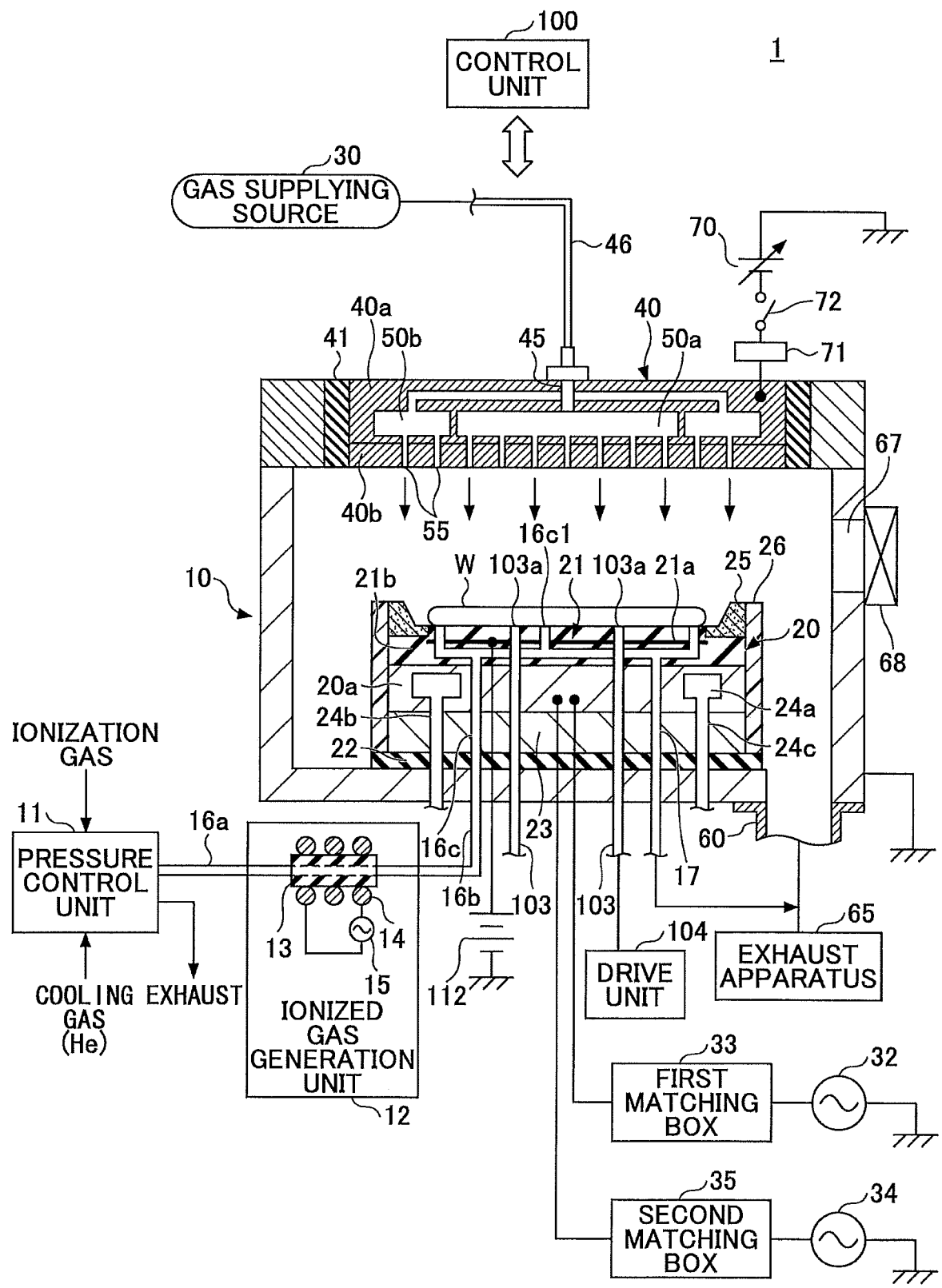
FIG. 1 is a drawing illustrating an example of a substrate processing apparatus according to an embodiment of the present invention.

In the following, an embodiment of the present invention will be described while making reference to the drawings. It should be noted that, in the present specification and the drawings, a same reference numeral is given to substantially a same structure, and duplicated descriptions will be omitted.

[Overall Configuration of Substrate Processing Apparatus]

First, referring to FIG. 1, an example of a substrate processing apparatus 1 will be described. A substrate processing apparatus 1 according to an embodiment of the present invention is a capacitively-coupled parallel-plate-type substrate processing apparatus, and includes a processing container 10 that has substantially a cylindrical shape. An alumite treatment (anodizing treatment) is applied to an inner surface of the processing container 10. The inside of the processing container 10 is a processing room in which a plasma process such as an etching process or a film forming process is performed by using plasma.

As an example of a substrate, a wafer W is placed on a platform 20. The platform 20 includes a base 20a and an electro-static chuck 21. The base 20a is made of conductive metal such as aluminum (Al), titanium (Ti), silicon carbide (SiC), etc., and has a function as a lower electrode. The electro-static chuck 21 has a function of electro-statically attracting the wafer W. The platform 20 is supported by a conductive support base 23 via an insulating plate 22. Further, a focus ring 25 is provided so as to surround the wafer W, in the circumference of an upper portion of the platform 20. The focus ring 25 is made of, for example, single crystal silicon. Further, an insulator ring 26 having a cylindrical shape is provided so as to surround the platform 20, the support base 23, and the outer circumferential surface of the focus ring 25. The insulator ring 26 is made of quartz, etc.

A first RF power source 32 is connected to the base 20a via a first matching box 33, and a second RF power source 34 is connected to the base 20a via a second matching box 35. The first RF power source 32 is used for generating plasma. High-frequency power with a predetermined frequency is supplied to the base 20a of the platform 20 from the first RF power source 32. Further, the second RF power source 34 is used for drawing an ion (used for a bias). High-frequency power with a predetermined frequency that is lower than the frequency of the first RF power source 32 is supplied to the base 20a of the platform 20 from the second RF power source 34.

Above the platform 20, facing the platform 20, a gas shower head 40 having a function as an upper electrode is provided in parallel with the platform 20. The gas shower head 40 and the platform 20 function as a pair of electrodes (an upper electrode and a lower electrode). It should be noted that, in an embodiment of the present invention, the high-frequency power used for generating plasma output from the first RF power source 32 is applied to the base 20a of the platform 20. However, the high-frequency power used for generating plasma may be applied to the gas shower head 40.

The electro-static chuck 21 has a structure in which an attracting electrode 21a is included in an insulator 21b. A DC power source 112 is connected to the electrode 21a. Further, by applying a DC voltage to the attracting electrode 21a from the DC power source 112, the wafer W is electro-statically attracted to the electro-static chuck 21.

A coolant flow path 24a is formed inside the platform 20. A coolant entrance piping 24b and a coolant exit piping 24c are connected to the coolant flow path 24a. The platform 20 is controlled to a predetermined temperature by circulating a coolant such as cooling water in the coolant flow path 24a.

Further, in order to supply a predetermined gas to a rear surface of the wafer W, a gas supplying pipes 16a and 16b, and a gas supplying path 16c that penetrates the platform 20, are provided. The gas supplying pipes 16a and 16b are connected to an ionized gas generation unit 12. The gas supplying path 16c is made of insulating material, or, insulating processing is applied to the inner surface of the gas supplying path 16c. During the plasma processing, the cooling gas (backside gas), such as a helium gas, supplied from a gas supplying source 30 is input to a pressure control unit 11, and is controlled to a predetermined pressure. The pressure-controlled gas passes through the gas supplying pipe 16a, passes through the ionized gas generation unit 12, passes through the gas supplying pipe 16b and the gas supplying path 16c, and is supplied to a gap between the wafer W and the electro-static chuck 21.

Further, after the plasma processing, an ionization gas, such as a helium gas, supplied from the gas supplying source 30 is input to the pressure control unit 11, and is controlled to a predetermined pressure. The pressure-controlled gas passes through the gas supplying pipe 16a, and is ionized in the ionized gas generation unit 12. As a result, the ionized gas is generated. The ionized gas passes through a gas supplying path 13, passes through the gas supplying pipe 16b and the gas supplying path 16c, and is supplied to the gap between the wafer W and the electro-static chuck 21.

The cooling gas and the ionized gas, that have been supplied to the gap, pass through a gas exhaust path 17, provided inside the platform 20, used for exhausting the gas supplied to the gap, and are exhausted by an exhaust apparatus 65 connected to the gas exhaust path 17.

There are multiple (e.g., three) lift pins 103 included in the platform 20. Here, only two lift pins 103 are illustrated in FIG. 1. The lift pins 103 are connected to a drive unit 104, and are moved in an up-and-down direction (vertical direction) by the drive unit 104.

The gas shower head 40 includes a body unit 40a and a top board 40b, and are provided in a top wall portion of the processing container 10. The gas shower head 40 is supported by the processing container 10 via an insulating member 41. The body unit 40a is made of conductive material (e.g., aluminum to which the anodizing treatment has been applied), and is enabled to support the top board 40b that is enabled to be attached to and detached from the lower portion of the body unit 40a.

Inside the body unit 40a, a gas diffusion room 50a is provided on the center side and a gas diffusion room 50b is provided on the circumference side. In the top board 40b under each of the gas diffusion rooms 50a and 50b, there are many gas holes 55 that are open to the processing container 10 side.

In the body unit 40a, there is a gas inlet 45 used for introducing a process gas to the gas diffusion rooms 50a and 50b. One end of a gas supplying piping 46 is connected to the gas inlet 45, and the other end of the gas supplying piping 46 is connected to the gas supplying source 30. From the gas supplying source 30, a predetermined process gas for plasma etching, etc., is supplied to the gas diffusion rooms 50a and 50b via the gas supplying piping 46. The process gas that has been diffused by the gas diffusion rooms 50a and 50b is supplied and dispersed into the processing container 10 like a shower via the gas holes 55.

A variable DC power source 70 is electrically connected to the gas shower head 40 via a low pass filter (LPF) 71. The variable DC power source 70 is enabled to turn on/off supplying power by using an on/off switch 72. The electric current of the variable DC power source 70 and the on/off state of the on/off switch 72 are controlled by the control unit 100. It should be noted that, when high frequency is applied to the platform 20 from the first RF power source 32 and the second RF power source 34 and plasma is generated in a processing space, the on/off switch 72 is turned on by the control unit 100 if necessary. According to the above arrangement, a predetermined DC voltage is applied to the gas shower head 40 as an upper electrode.

An exhaust pipe 60 is provided in the bottom of the processing container 10, and an exhaust apparatus 65 is connected to the bottom of the processing container 10 via the exhaust pipe 60. The exhaust apparatus 65 includes a vacuum pump. The pressure inside of the processing container 10 is reduced to a predetermined degree of vacuum by operating the vacuum pump. A loading/unloading opening 67 for the wafer W is provided on a side wall in the processing container 10, and a gate valve 68 for opening/closing the loading/unloading opening 67 is provided.

The operations of the substrate processing apparatus 1 are controlled by the control unit 100. A CPU, a memory, and a user interface are provided in the control unit 100. The user interface includes, for example, a keyboard that is operated by a process manager for inputting a command for controlling the substrate processing apparatus 1, and a display that is used for displaying a visualized operational state of the substrate processing apparatus 1.

A control program (software), which is executed by the CPU to realize a function, and recipes, in which processing condition data is included, are stored in the memory. Further, the control program and the recipes including the processing condition data may be used in a state in which the control program and the recipes are stored in a computer readable recording medium (e.g., hard disk, CD, flexible disk, semiconductor memory). The control program and the recipes including the processing condition data may be used in an online state in which the control program and the recipes are transmitted from other apparatuses as required via, for example, a private line.

When loading the wafer W, the gate valve 68 is opened, the wafer W is carried into the processing container 10 through the loading/unloading opening 67, the lift pins 103 move upwards, the wafer W is passed from an arm to the lift pins 103, and the wafer W is supported by the lift pins 103. The lift pins 103 are moved by the drive of the drive unit 104 in an up-and-down direction. When the lift pins 103 go down and the wafer W is placed on the platform 20, a DC voltage is applied to the attracting electrode 21a from the DC power source 112, and the wafer W is attracted to and retained by the electro-static chuck 21.

A process gas is supplied from the gas supplying source 30 into the processing container 10. High-frequency power for plasma generation is applied to the platform 20 from the first RF power source 32, and high-frequency power for drawing ions is applied to the platform 20 from the second RF power source 34. With the above operations, a predetermined plasma process is applied to the wafer W according to an action of the plasma generated above the wafer W and according to the drawing of ions.

After the plasma process, applying the DC voltage to the attracting electrode 21a from the DC power source 112 is stopped, and the static electricity elimination is performed by supplying the ionized gas to a gap between the wafer W and the electro-static chuck 21. After the static electricity elimination, the wafer W is removed from the electro-static chuck 21 smoothly and safely, the lift pins 103 move upwards, and the wafer W is supported by the lift pins 103. The gate valve 68 is opened, the wafer W is passed from the lift pins 103 to the arm, and the wafer W is carried out through the loading/unloading opening 67.

[Residual Charges]

Figure 2:
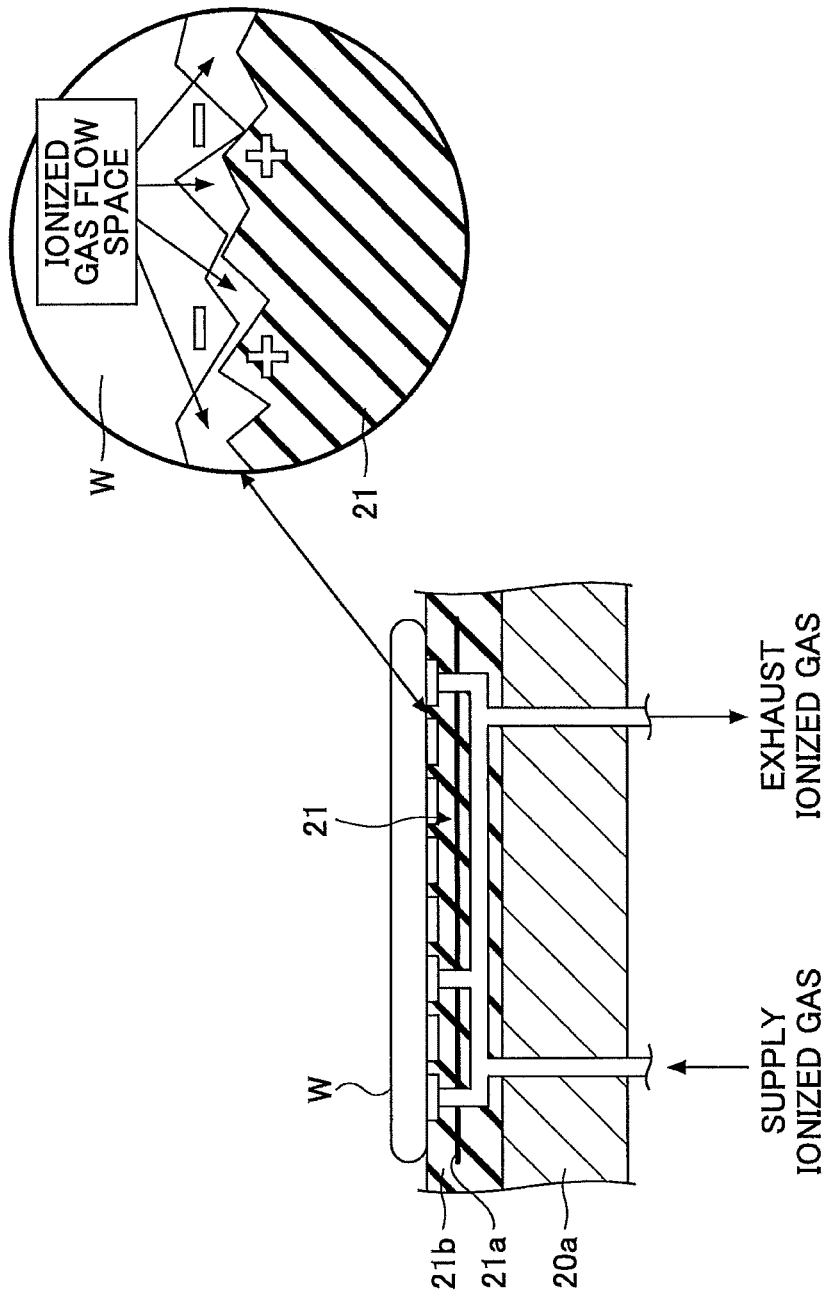
FIG. 2 is a drawing illustrating a state of an interface between a wafer and an electro-static chuck according to an embodiment of the present invention.

The right side of FIG. 2 is an enlarged drawing in which a state of an interface between the wafer W and the electro-static chuck 21 illustrated on the left side is enlarged. There are gaps in the interface between the wafer W and the electro-static chuck 21 due to the dotted unevenness (dotted protrusions and indentations) formed in the surface of the electro-static chuck 21. The gaps serve as a space in which the ionized gas flows.

After the plasma process is finished, even if the voltage that has been applied to the attracting electrode 21a of the electro-static chuck 21 is turned off, the residual charges may still remain in the electro-static chuck 21 and objects adhered to the surface of the electro-static chuck 21. When the wafer W is removed in the above state, load may be added to the wafer W due to the residual charges, the positional shift may occur, and the wafer W may be broken.

On the other hand, in a substrate processing apparatus 1 according to an embodiment of the present invention, the ionized gas generated in the ionized gas generation unit 12 is caused to flow in the gaps between the wafer W and the electro-static chuck 21. As illustrated in FIG. 2, it is preferable that supplying holes of the ionized gas and exhaust holes of the ionized gas be provided in the indentations between the dotted protrusions. The above arrangement is preferable because the ionized gas is diffused from the indentations between the dotted protrusions uniformly to the entire rear surface of the wafer W, and because it is easy to exhaust the ionized gas. With the above arrangement, the residual charges are eliminated according to the action of the ionized gas that has been diffused uniformly to the entire rear surface of the wafer W, and it is possible to remove the wafer W smoothly.

The electro-static chuck 21 may include multiple protrusions, in the surface of the electro-static chuck 21, that are in contact with the wafer W. In an embodiment of the present invention, the multiple protrusions are dotted protrusions. The protrusions may be arranged in a manner of concentric circles, in a manner of a lattice, in a manner of an involute curve, in a radial manner, or at random.

[Ionized Gas Supplying System]

Next, an ionized gas supplying system included in a substrate processing apparatus 1 according to an embodiment of the present invention will be described in detail. The ionized gas supplying system includes a pressure control unit 11, an ionized gas generation unit 12, a gas supplying pipes 16a and 16b, a gas supplying path 16c, and a gas exhaust path 17.

The pressure control unit 11 controls pressures of a cooling gas and an ionization gas. During the plasma processing of the wafer W, a cooling gas such as a helium gas (He) is supplied to the pressure control unit 11 from the gas supplying source 30. The pressure of the cooling gas is controlled by the pressure control unit 11. After passing through the gas supplying pipe 16a, through the gas supplying path 13 made of insulating material in the ionized gas generation unit 12, through the gas supplying pipe 16b, and through the gas supplying path 16c, the cooling gas is supplied to the rear surface of the wafer W, and thus, the gap between the wafer W and the electro-static chuck 21 is filled with the cooling gas. At this time, the RF power source 15 of the ionized gas generation unit 12 is turned off, and no current flows in an ICP (Inductively Coupled Plasma) coil 14 that is wound on an insulating material. Therefore, during the plasma processing, the cooling gas that passes through the gas supplying path 13 is not ionized. The non-ionized cooling gas passes through the gas supplying pipe 16b and the gas supplying path 16c, is supplied to the rear surface of the wafer W, and contributes to adjusting the temperature of the wafer W. The cooling gas that has been supplied to the rear surface of the wafer W passes through the gas exhaust path 17, and is exhausted from the exhaust apparatus 65.

After applying the plasma process to the wafer W, the gas supplying source 30 stops supplying the cooling gas and the pressure control unit 11 exhausts the cooling gas. After the above, an oxygen-containing gas, such as a helium gas, an argon (Ar) gas, and an oxygen (O2) gas, is supplied to the pressure control unit 11 as an ionization gas from the gas supplying source 30. The ionization gas may be a rare gas (noble gas). It should be noted that, in the case where the cooling gas and the ionization gas is the same gas, the gas supplying source 30 continues supplying the same gas to the pressure control unit 11, and it is not necessary for the pressure control unit 11 to exhaust the gas.

The pressure of the ionization gas is controlled by the pressure control unit 11. After passing through the gas supplying pipe 16a, through the gas supplying path 13 made of insulating material, through the gas supplying pipe 16b, and through the gas supplying path 16c, the ionization gas is supplied to the rear surface of the wafer W, and thus, the gap between the wafer W and the electro-static chuck 21 is filled with the ionization gas. At this time, the RF power source 15 of the ionized gas generation unit 12 is turned on, a current flows in an ICP coil 14 that is wound on an insulating material, and plasma is generated in the gas supplying path 13 that is made of insulating material. When passing through the gas supplying path 13, the pressure-controlled gas is ionized according to the action of the plasma to become an ionized gas.

The ionized gas passes through the gas supplying path 13 made of insulating material, and is carried to the gas supplying pipe 16b. The gas supplying path includes an insulating material. It is preferable that the insulating material be made of, for example, a ceramic. Any one of alumina, yttria, zirconia, silicon nitride, silicon carbide, and aluminum nitride, may be an example of the ceramic. As described above, in an embodiment of the present invention, it is possible for the control unit 100 to supply an ionized gas by using the ICP by turning on the RF power source 15 of the ionized gas generation unit 12, and it is possible to stop supplying the ionized gas by turning off the RF power source 15.

The gas supplying pipes 16a and 16b, used as a BP (Back Pressure) Line for carrying a gas from the pressure control unit 11, are stainless pipes, which are used for supplying the cooling gas to the electro-static chuck 21. In an embodiment of the present invention, a part of the stainless pipes is replaced with the gas supplying path 13 including an insulating material, and the ICP coil 14 is wound on an insulating material. By supplying a high-frequency current from the RF power source 15 to the ICP coil 14, a gas that moves inside the gas supplying path 13 is ionized.

Further, in an embodiment of the present invention, a mechanism of ionizing a gas by using plasma is included in which plasma is generated by supplying the high-frequency current, which does not touch the gas, to the ICP coil 14 from outside the gas supplying path 13 that is made of insulating material. Further, in an embodiment of the present invention, the generated ionized gas passes through the gas supplying path 13 made of insulating material. According to the above mechanism, it is possible to prevent ions from being stolen by the piping made of metal such as stainless, and from disappearing.

According to the above, it is possible to prevent the decreased ionization efficiency of the ionized gas supplied to the gap between the rear surface of the wafer W and the electro-static chuck 21. As a result, after the plasma processing, the ionized gas, that has been ionized by the ionized gas generation unit 12, passes through the gas supplying path 13 and the gas supplying pipes 16b and 16c, and is supplied to the rear surface of the wafer W, and thus, the static electricity elimination is performed by the ionized gas, efficiently and quickly. The ionized gas that has been supplied to the rear surface of the wafer W passes through the gas exhaust path 17, and is exhausted from the exhaust apparatus 65.

It should be noted that, in an embodiment of the present invention, the ionized gas generation unit 12 ionizes the gas according to an ICP. However, it is not limited to the ICP. The ionized gas generation unit 12 may ionize the gas according to any one of ICP, microwave plasma, and DC discharge plasma.

Figure 3:
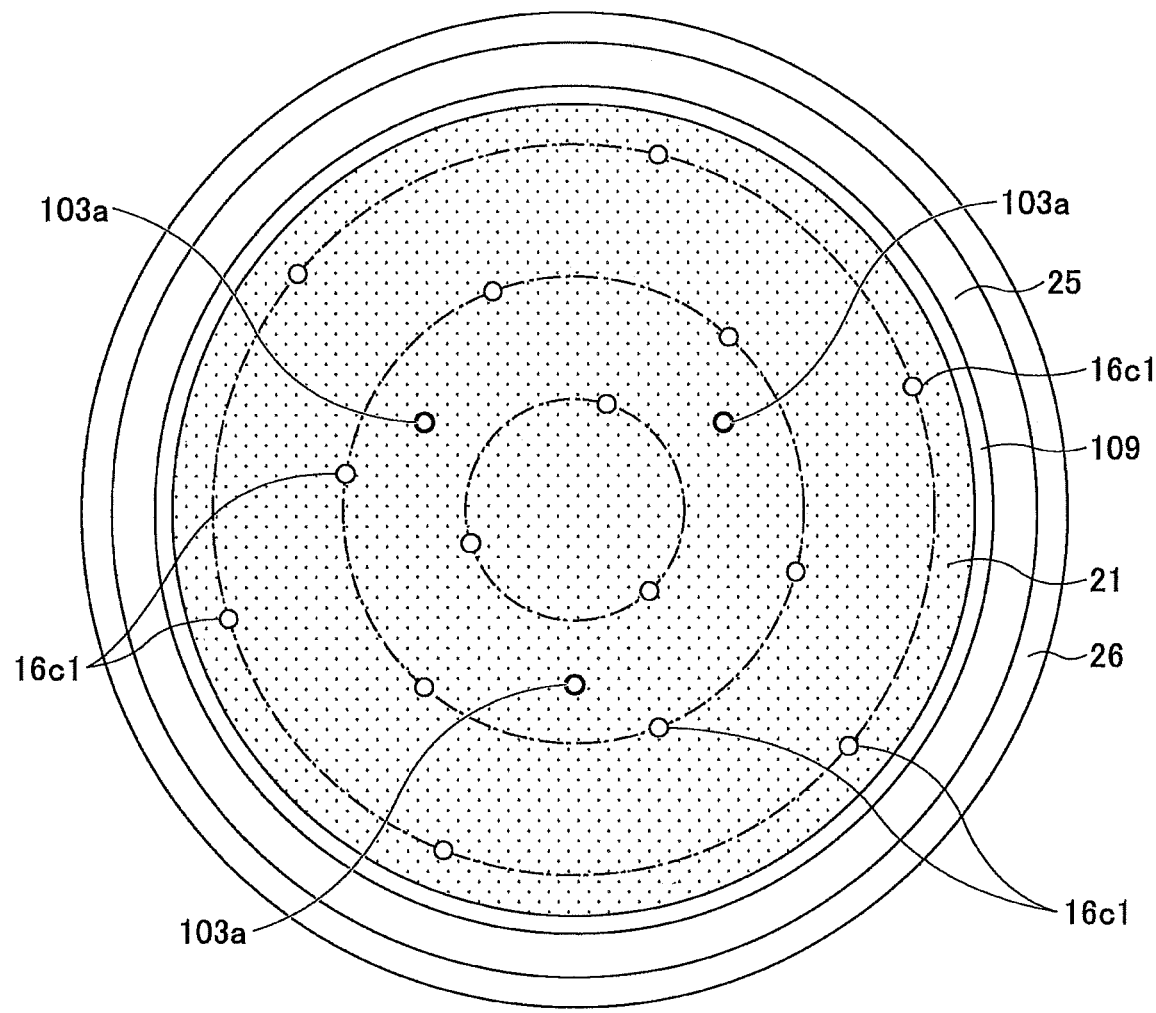
FIG. 3 is a drawing illustrating a structure of an upper surface and surroundings of an electro-static chuck according to an embodiment of the present invention.

FIG. 3 is a drawing illustrating examples of structures of an upper surface and surroundings of an electro-static chuck 21 according to an embodiment of the present invention. The circumference of the electro-static chuck 21 whose surface is formed with dots is shielded by a shield band 109. A focus ring 25 is provided on the platform 20 outside the shield band 109 surrounding the electro-static chuck 21, so as to surround the wafer W. Further, an insulator ring 26 made of an annular member is provided so as to surround the circumference of the focus ring 25.

A plurality of holes 16c1 used for supplying and exhausting the ionized gas are provided in the electro-static chuck 21. The holes 16c1 used for supplying and exhausting the ionized gas are also used as holes for the cooling gas. In an embodiment of the present invention, the holes 16c1 used for supplying and exhausting the ionized gas are arranged in a manner of concentric circles. It should be noted that the arrangement of the holes 16c1 used for supplying and exhausting the ionized gas is not limited to the above. Further, three lift-pin holes 103a are provided in the electro-static chuck 21.

According to a graph based on Paschen's law, abnormal discharges tend to occur at a pressure corresponding to the local minimum point of the graph. In order to reduce the occurrence of abnormal discharges, this local minimum point may be avoided by causing the pressure of the gap between the rear surface of the wafer W and the electro-static chuck 21 to be shifted to a pressure higher than the pressure corresponding to the local minimum point.

Further, in the case of increasing the pressure of the gap between the rear surface of the wafer W and the electro-static chuck 21, it is considered to use a Johnsen-Rahbek force (effect) type electro-static chuck, whose electro-static attraction force is greater. In a case where this type of electro-static chuck is used, the residual charges remain more than the residual charges that remain when a Coulomb's force type electro-static chuck is used. In this case, it is possible to quickly and sufficiently remove the charges that remain in the rear surface of the wafer W and the electro-static chuck 21 by supplying the ionized gas to the gap between the wafer W and the electro-static chuck 21 by uniformly covering the entire rear surface of the wafer W.

Therefore, in an embodiment of the present invention, dotted protrusions are provided in the surface of the electro-static chuck 21, the ionized gas passes through the space of the indentations between the dotted protrusions, and the ionized gas is supplied to the entire rear surface of the wafer W uniformly. Further, in an embodiment of the present invention, there are spaces formed by a plurality of tiny dotted protrusions and indentations provided in the surface of the electro-static chuck 21 (e.g., a space in which the ionized gas flows illustrated in an enlarged drawing of FIG. 2), and the ionized gas flows uniformly in the gaps between the wafer W and the electro-static chuck 21 covering the entire rear surface of the wafer W. With the above arrangement, even in a state in which the pressure in the gap between the wafer W and the electro-static chuck 21 is high and there are many residual charges, it is still possible to quickly and sufficiently remove the charges that remain in the rear surface of the wafer W and the electro-static chuck 21. It should be noted that, even in the case where a Coulomb's force type electro-static chuck or other types of electro-static chucks are used, a substrate removing method according to an embodiment of the present invention is still effective.

With the above arrangement, after the plasma processing, it is possible to smoothly remove the wafer W from the electro-static chuck 21 by removing the residual charges and optimizing the pressure based on the relationship between the pressure of the gaps and the static electricity elimination efficiency, the gaps being provided between the rear surface of the wafer W and the electro-static chuck 21.

Further, as illustrated in FIG. 1, in a substrate processing apparatus 1 according to an embodiment of the present invention, a structure for exhausting gas is not provided inside the processing container 10. With the above arrangement, it is possible to reduce sources of particle generation. Therefore, it is possible to cause the plasma to be uniform, and it is possible to perform the process stably without being affected by the particles during the processing.

For example, the gas exhaust path 17 used for exhausting the gas from the gap between the rear surface of the wafer W and the electro-static chuck 21 is formed inside the electro-static chuck 21, and the exhaust path is completed inside the electro-static chuck 21. With the above arrangement, in a substrate processing apparatus 1 according to an embodiment of the present invention, even in the case where the insulator ring 26 is provided, the rear surface of the wafer W can still be monitored. Further, the gas flow is completed in the rear surface of the wafer W, which does not affect the exhaust of the process gas.

[Substrate Removing Process]

Figure 4:
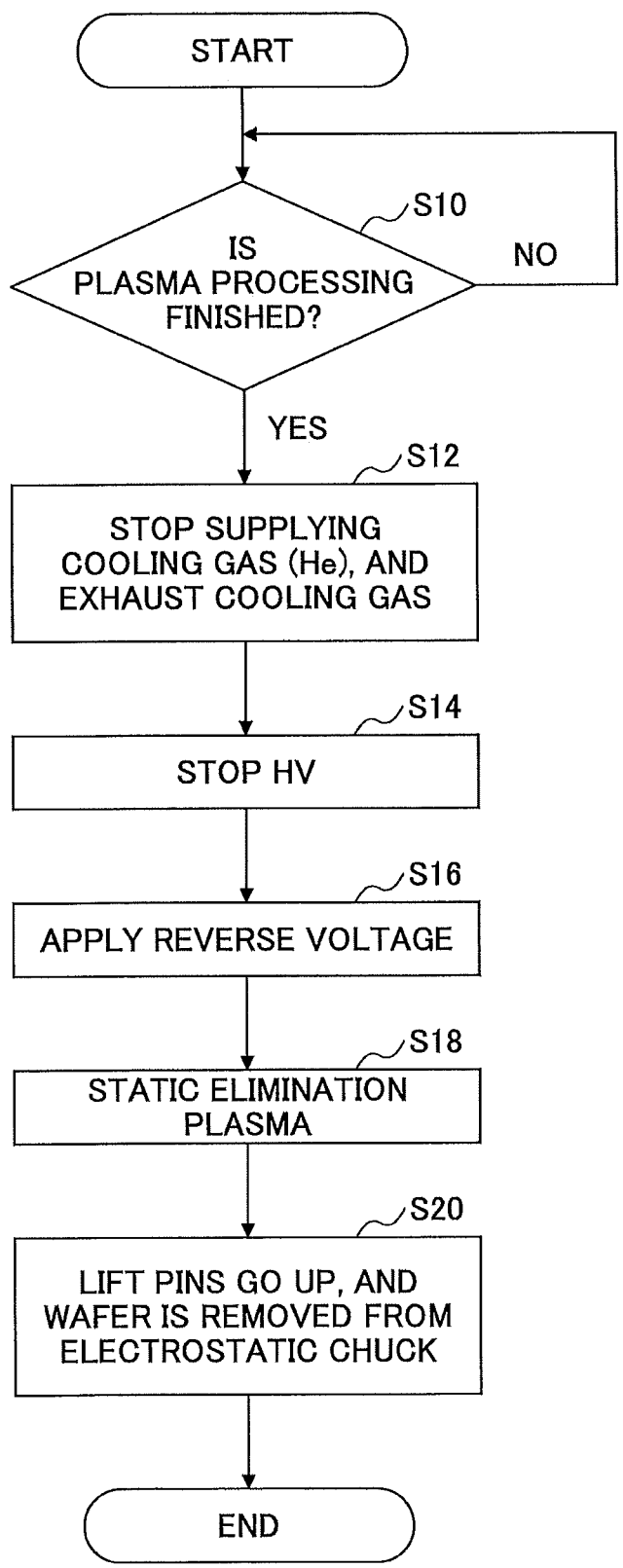
FIG. 4 is a flowchart illustrating an example of conventional substrate removing processing.

Next, after describing the conventional substrate removing processing by referring to FIG. 4, a substrate removing processing according to an embodiment of the present invention will be described by referring to FIG. 5. FIG. 4 is a flowchart illustrating an example of conventional substrate removing processing (including static electricity elimination processing).

(Conventional Substrate Removing Processing)

In the conventional substrate removing processing illustrated in FIG. 4, first, the control unit 100 determines whether the plasma processing is finished (step S10). In the case where it is determined that the plasma processing is finished, the control unit 100 stops supplying a cooling gas such as a helium (He) gas from the gas supplying source 30, and exhausts the cooling gas from the pressure control unit 11 (step S12).

Next, the control unit 100 stops applying a voltage HV to the attracting electrode 21a of the electro-static chuck 21 (step S14). Next, the control unit 100 applies a voltage (a reverse voltage) whose electrical polarity is opposite to the voltage HV that has been applied to the attracting electrode 21a (step S16).

Next, the control unit 100 generates plasma, and removes the residual charges by using the plasma discharge of the charges remaining on the rear surface of the wafer W and on the upper surface of the electro-static chuck 21 (step S18). After the static electricity elimination, the control unit 100 causes the lift pins 103 to move upwards, and removes the wafer W from the electro-static chuck 21 (step S20). The control unit 100 causes the wafer W to be supported by the lift pins 103, and carries the wafer W out of the substrate processing apparatus 1 by passing the wafer W to the arm.

(Substrate Removing Processing According to an Embodiment of the Present Invention)

Figure 5:
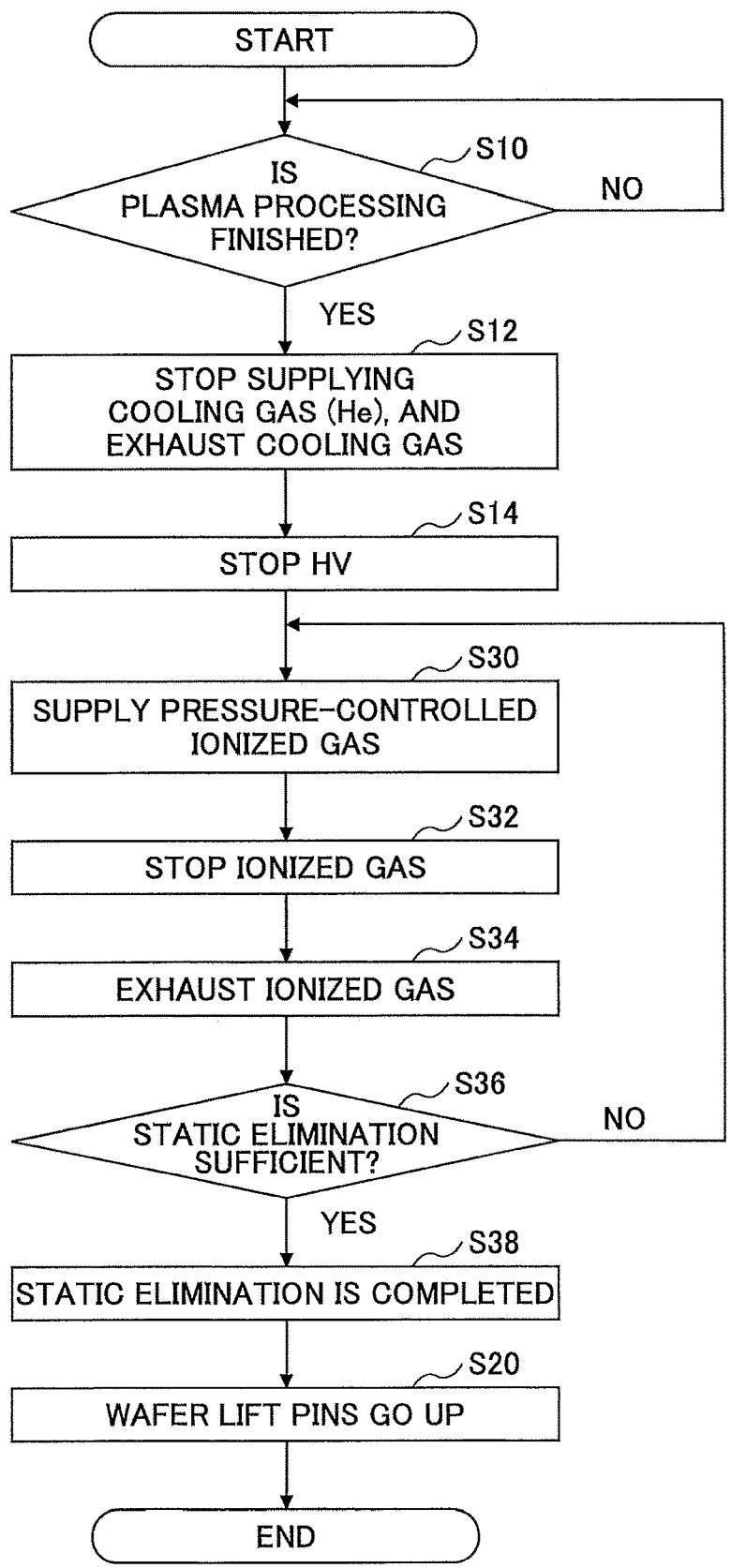
FIG. 5 is a flowchart illustrating an example of substrate removing processing according to an embodiment of the present invention.

As opposed to the conventional substrate removing processing described above, in an embodiment of the present invention, the wafer W is removed according to the procedure illustrated in FIG. 5. FIG. 5 is a flowchart illustrating an example of a substrate removing processing (including static electricity elimination processing) according to an embodiment of the present invention.

In a substrate removing processing according to an embodiment of the present invention, first, the control unit 100 determines whether the plasma processing is finished (step S10). In the case where it is determined that the plasma processing is finished, the control unit 100 stops supplying a cooling gas such as a helium (He) gas from the gas supplying source 30, and exhausts the cooling gas from the pressure control unit 11 (step S12).

Next, the control unit 100 stops applying a voltage HV to the attracting electrode 21a of the electro-static chuck 21 (step S14). Next, the control unit 100 supplies an ionized gas, whose pressure is controlled by the pressure control unit 11, to a gap between the wafer W and the electro-static chuck 21 (step S30). Specifically, the control unit 100 causes a gas, whose pressure is controlled by the pressure control unit 11, to be ionized by the ionized gas generation unit 12. The ionized gas that has been generated as described above passes through the gas supplying path 13 made of insulating material and the gas supplying pipes 16a and 16b, and is supplied to the gap between the wafer W and the electro-static chuck 21.

Next, the control unit 100 stops supplying the ionized gas to the gap between the wafer W and the electro-static chuck 21 (step S32). Further, the control unit 100 exhausts the ionized gas that has been supplied to the gap between the wafer W and the electro-static chuck 21 through the gas exhaust path 17 provided inside the platform 20 (step S34).

Next, the control unit 100 determines whether the static electricity elimination is sufficient (step S36). As an example of a method of determining whether the static electricity elimination is sufficient, there is a method in which the wafer W is caused to make micro vibrations before disengagement of the wafer, and the amount of the wafer residual charges is calculated by measuring an induced current generated at the attracting electrode 21a of the electro-static chuck 21. For example, in the specification of Japanese application No. 2016-251572, paragraphs 0071 through 0078, and FIG. 8, an example of calculation of the wafer residual charge amount and static electricity elimination processing is described in which an induced current $i_3(t)$ is used that is generated at the attracting electrode 21a when micro vibrations are made on the wafer. The induced current $i_3(t)$ can be calculated according to formula (15) in paragraph 0063. It should be noted that the method of determining whether the static electricity elimination is sufficient is not limited to the above method.

In the case where the control unit 100 determines that the static electricity elimination is not sufficient, the flow returns to step S30, and the static electricity elimination processing of steps S30 through S34 is performed again. In step S36, in the case where the control unit 100 determines that the static electricity elimination is sufficient, the control unit 100 determines that the static electricity elimination is completed (step S38), causes the lift pins 103 to move upwards, and removes the wafer W from the electro-static chuck 21 (step S20). The control unit 100 causes the wafer W to be supported by the lift pins 103, and carries the wafer W out of the substrate processing apparatus 1 by passing the wafer W to the arm.

It should be noted that in substrate removing processing according to an embodiment of the present invention, after stopping application of the voltage HV to the attracting electrode 21a, a reverse voltage may be applied before supplying the ionized gas.

As described above, according to a substrate processing apparatus 1 and substrate removing processing according to an embodiment of the present invention, it is possible to remove the residual charges that remain in the gap between the wafer W and the electro-static chuck 21 sufficiently and quickly, and it becomes possible to remove the wafer W smoothly and safely. Further, additional cost can be reduced by using the supplying path for the cooling gas and the ionized gas in common.

As described above, a substrate processing apparatus and substrate removing processing according to an embodiment of the present invention have been described. The substrate processing apparatus and the substrate removing processing are not limited to the above-described embodiments, and various variations and modifications can be made within the scope of the present invention. Matters described in the embodiments may be combined within the non-conflicting range.

For example, the method of electro-static attraction by the electro-static chuck may be any one of a Coulomb's force type, a Johnsen-Rahbek force (effect) type, or a gradient type.

Further, in a substrate processing apparatus and substrate removing processing according to an embodiment of the present invention, the charges to be eliminated may be positive charges or negative charges.

Further, in a substrate processing apparatus according to an embodiment of the present invention, any type of Capacitively Coupled Plasma (CCP), Inductively Coupled Plasma (ICP), Radial Line Slot Antenna, Electron Cyclotron Resonance Plasma (ECR), and Helicon Wave Plasma (HWP) may be used.

In the present specification, a semiconductor wafer W is described as an example of a substrate. However, the substrate is not limited to the above. The substrate may be various types of substrate used for LCD (Liquid Crystal Display), FPD (Flat Panel Display), a photo mask, a CD substrate, a print board, etc.

The present application is based on and claims the benefit of priority of Japanese Priority Application No. 2017-086675 filed on Apr. 25, 2017, the entire contents of which are hereby incorporated herein by reference.

What is claimed is:

1. A substrate processing apparatus comprising:
    an electro-static chuck configured to retain a substrate on a platform by electro-static attraction;
    an ionized gas generation unit configured to generate an ionized gas by ionizing a pressure-controlled gas;
    a gas supplying path, which is made of insulating material or to whose inner surface insulating treatment is applied, configured to allow passage of the generated ionized gas;
    a gas supplying pipe configured to supply the ionized gas that has passed the gas supplying path to a gap between the substrate and the electro-static chuck; and
    a gas exhaust path, which is provided inside the platform, configured to exhaust the gas that has been supplied to the gap, wherein
    an ICP coil is wound on an insulating material in the ionized gas generation unit.

2. The substrate processing apparatus according to claim 1, wherein a plurality of protrusions contacting the substrate are included in a surface of the electro-static chuck.

3. The substrate processing apparatus according to claim 2, wherein the plurality of the protrusions are arranged in a manner of concentric circles, in a manner of a lattice, in a manner of an involute curve, in a radial manner, or at random.

4. The substrate processing apparatus according to claim 1, wherein the gas to be ionized is an oxygen-containing gas.

5. The substrate processing apparatus according to claim 1, wherein the gas to be ionized is a rare gas.

6. The substrate processing apparatus according to claim 1, wherein the gas supplying path is made of insulating material.

7. The substrate processing apparatus according to claim 6, wherein the insulating material is made of a ceramic.

8. The substrate processing apparatus according to claim 7, wherein the ceramic is any one of alumina, yttria, zirconia, silicon nitride, silicon carbide, and aluminum nitride.

9. The substrate processing apparatus according to claim 1, wherein the ionized gas generation unit ionizes the gas according to any one of Capacitively Coupled Plasma (CCP), Inductively Coupled Plasma (ICP), microwave plasma, and DC discharge plasma.

10. The substrate processing apparatus according to claim 1, wherein the ionized gas generation unit generates the ionized gas by ionizing the pressure-controlled gas without contact.

11. The substrate processing apparatus according to claim 1, further comprising: a focus ring provided on the platform so as to surround the substrate; and
    an annular member provided so as to surround the circumferential surface of the focus ring, wherein
    the annular member is made of insulating material.

12. A substrate removing method of removing a substrate on a platform from an electro-static chuck that retains the substrate by electrostatic attraction, the substrate removing method comprising:
    generating an ionized gas by ionizing a pressure-controlled gas by using an ionized gas generation unit;
    allowing the generated ionized gas to pass through a gas supplying path, the gas supplying path being made of insulating material or insulating treatment being applied to an inner surface of the gas supplying path;
    supplying the ionized gas that has passed through the gas supplying path to a gap between the substrate and the electro-static chuck;
    exhausting the gas that has been supplied to the gap through a gas exhaust path provided inside the platform; and
    removing the substrate on the platform from the electro-static chuck, wherein
    an ICP coil is wound on an insulating material in the generating the ionized gas.

* * * * *